United States Patent [19]

Pereda

[11] 4,164,702
[45] Aug. 14, 1979

[54] APPARATUS TO TEST PROPER WIRING OF ELECTRICAL WALL RECEPTACLES ESPECIALLY IF THE GROUND AND NEUTRAL WIRES ARE REVERSED WITH RESPECT TO THE HOT WIRE

[76] Inventor: Eugene F. Pereda, 11621 Hughes NE., Albuquerque, N. Mex. 87112

[21] Appl. No.: 841,071

[22] Filed: Oct. 31, 1977

Related U.S. Application Data

[63] Continuation of Ser. No. 744,085, Nov. 22, 1976, abandoned.

[51] Int. Cl.$^2$ ............................................. G01R 31/02
[52] U.S. Cl. ..................................................... 324/51
[58] Field of Search ........................... 324/51; 340/656

[56] References Cited

U.S. PATENT DOCUMENTS

| | | | |
|---|---|---|---|
| 3,205,436 | 9/1965 | Donahue | 324/51 |
| 3,383,588 | 5/1968 | Stoll et al. | 324/51 |
| 3,821,639 | 6/1974 | DeLangis | 324/51 |
| 3,872,383 | 3/1975 | Kolodziej | 324/51 |
| 3,878,458 | 4/1975 | Muska | 324/51 |
| 3,898,557 | 8/1975 | Strock | 324/51 |
| 3,952,244 | 4/1976 | Spear | 324/51 |
| 3,984,765 | 10/1976 | Rocci | 324/51 |

FOREIGN PATENT DOCUMENTS

| | | | |
|---|---|---|---|
| 771537 | 4/1957 | United Kingdom | 324/51 |
| 807544 | 1/1959 | United Kingdom | 324/51 |
| 892468 | 3/1962 | United Kingdom | 324/51 |

*Primary Examiner*—Gerard R. Strecker

[57] ABSTRACT

An electrical tester to test wall type electrical receptacles, such as are commonly seen in a home, such receptacles consisting of a so called "female plug" of the three wire kind that provides electric power to appliances used in the home or in establishments. The tester has the intrinsic property of detecting if the Ground and Neutral wires to such a receptacle are reversed with respect to the Hot wire. The tester also detects common defects such as reversals between Hot and Ground wires or between Hot and Neutral wires, or for "open" conditions in such wires to the receptacle. The tester will definitely establish if proper orientation of both Neutral and Ground wires to the receptacle exists with respect to the Hot wire, especially so if the three wire cable that connects to such a receptacle is of the type allowed to have a smaller cross section wire for the Ground than for the Neutral and Hot wires. The tester is a hand held apparatus having three indicating lights, a spring loaded push button reversible switch and a calibrated adjustable potentiometer. The tester is easy to use and its indications do not depend on or measure the quality of "earth's grounds" but is mainly for the use of determining the proper wiring of such wall sockets.

1 Claim, 6 Drawing Figures

APPARATUS TO TEST PROPER WIRING OF ELECTRICAL WALL RECEPTACLES ESPECIALLY IF THE GROUND AND NEUTRAL WIRES ARE REVERSED WITH RESPECT TO THE HOT WIRE

This application is a continuation of application Ser. No. 744,085, filed 11/22/76, now abandoned.

BACKGROUND OF THE INVENTION

Commonly available testers of electrical wall sockets do not test for Neutral and Ground wire reversals with respect to the Hot wire and specifically denote this in their operating instructions.

SUMMARY OF THE INVENTION

Since the National Electrical Code (see pp. 70–75 of the National Electrical Code Handbook, article No. 250 on Grounding and Table 250–94 (a) of the 1968 code as edited by the National Fire Protection Association, 60 Batterymarch St., Boston, Mass) allows smaller size wires for the Ground runs in electrical installation compared to the Neutral ground runs this difference in wire resistance is used to detect where the ground wire is located with respect to the Hot wire. Other polarity defects are also tested for, using neon bulbs for indication of such defects.

BRIEF DESCRIPTION OF THE DRAWINGS

FIG. 6 depicts the electrical fault known as Hot line to Neutral line reversal. This could be a very common fault and an undetectable one if not tested for.

DESCRIPTION OF THE PREFERRED EMBODIMENTS

Figure 1:
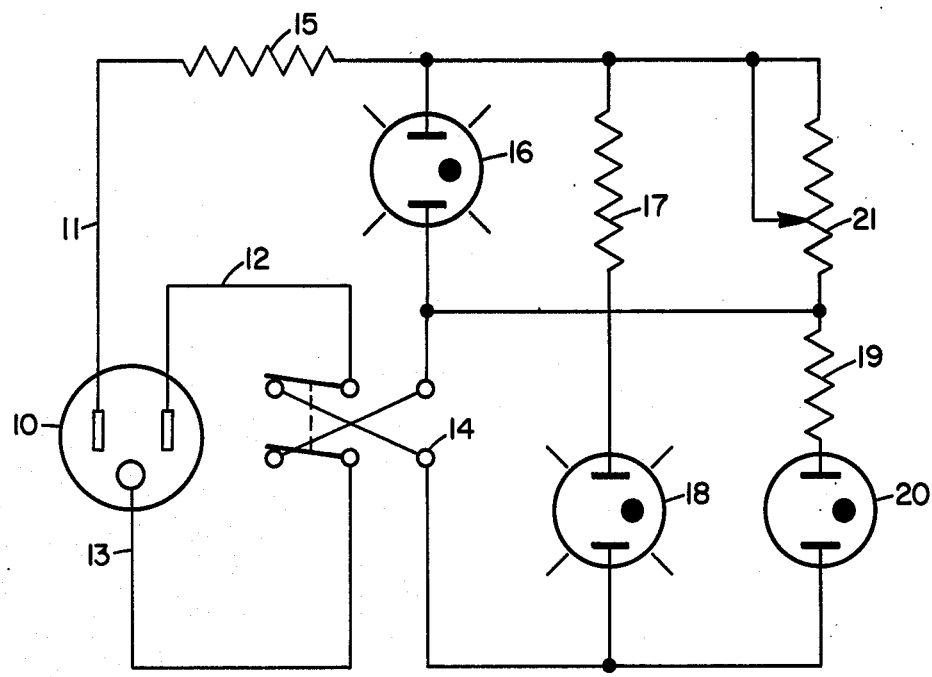
FIG. 1 shows an electrical schematic of the invention but not drawn with respect to facility of operation of the device. Such views showing operation are to be described later.
Figure 2:
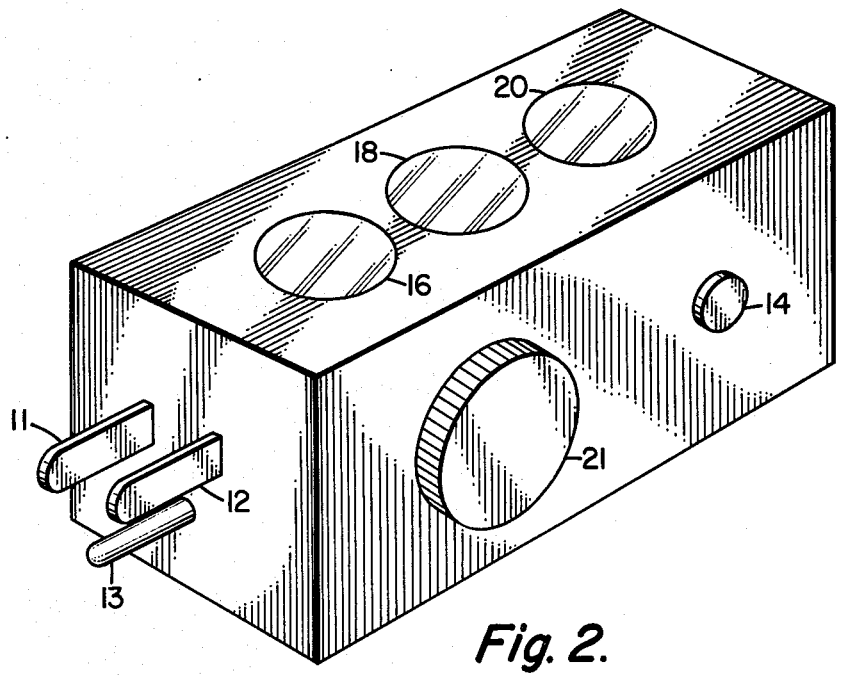
FIG. 2 shows a pictorial view of the invention as it would look physically, (a hand held tester pluggable into a wall receptacle in a home electrical wiring or in an establishment.)
Figure 3:
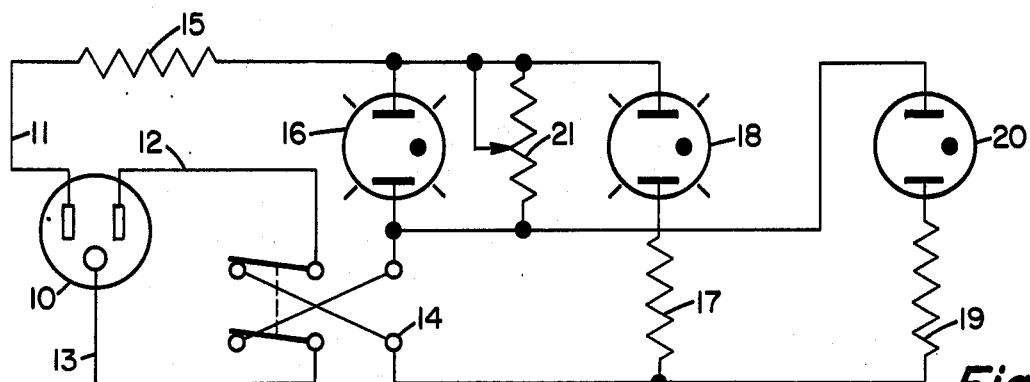
FIG. 3 is an exact replica of FIG. 1 electrically but much easier to trace, and as FIG. 1 it depicts the invention connected to the electrical wall receptacle with no faults or errors in circuit polarity existing.

FIG. 1 is an electrical schematic of the invention. A pictorial drawing of FIG. 1 is given in FIG. 2. FIG. 3 is a better electrical schematic diagram than FIG. 1 in order to show the "logic" or sequence of lighting of the neon lights (neon kind with two tips) in correspondance with the list of such sequences in the Table below entitled Neon Lamp "Logic" Display Table, consisting of the condition of the lamps being ON or OFF when the invention is plugged into an electrical wall socket. The invention incorporated a large Ground/Neutral reversal effect when switch No. 14 of FIG. 1 is pressed. Before referring to the actual operation of the invention it should be emphasized that not to be able to simulate a Neutral wire Ground wire reversal with respect to the Hot wire means that such a defect is possible to already exist. If the installation is correct the invention positively so indicates by means of the simulated reversal of the Ground and Neutral wires with respect to the Hot wire. It is in this respect that the invention surpasses the present available testers that surmise to tell that the electrical installation is correct since they can not discern if the ground and neutral wires are reversed.

Let us begin the use of the invention assuming that we have a completely correctly wired wall-socket installation. One inserts the tester (invention) in the wall-socket of the installation to be tested. This is normally an installation having a wall-socket which is called the "female" counterpart of part No. 10 in FIG. 1, or FIG. 2 in the DRAWINGS. If the wiring is correct (and we assumed we were testing a correct installation) the logic in the lighting of lamps shown as No. 16 No. 18 and No. 20 in the Table given below is as given in such table. Other defects in polarity are denoted by the Table if such defects in the wiring exist. Note that such defects (corresponding to the logic lighting of the lamps as denoted in the Table) in wiring are repeated for convenience (so as to be clearly shown electrically) and correspondingly given in the schematics of FIGS. 3 to FIG. 6. There is no electrical potential between the Neutral and Ground wires in a correct installation and the schematics of FIG. 3 to FIG. 6 show a neon lamp connected between such wires with the table showing that such lamp being in the OFF condition. However, to test for Ground Neutral reversal with respect to the Hot wire requires a special test procedure using the invention. This test is conveniently shown electrically in FIG. 4, where lamp No. 20 necessarily has to be OFF but where lamp No. 18 will also go OFF if the defect does not exist. This test consists in adjusting potentiometer No. 21 in the Schematic of FIG. 3 so that upon pressing switch NO. 14 bulb No. 18 goes OFF. If this test is not possible there is a possibility that the Ground and Neutral wires are reversed with respect to the Hot wire. In other words, the testing procedure here describes is invalidated if a defect in polarity exists in the wiring. If the test is possible (shown by lamp No. 18 going OFF upon pressing switch No. 14) the defect known as Ground to Neutral reversal with respect to the Hot wire does not exist in that installation.

Electrically speaking, in a normal (correct) installation there is usually less resistance in the Neutral Wire run than there is in the Ground Wire run. The larger resistance of the ground wire run is placed in place of the Neutral wire giving electricity to bulb No. 18 of FIG. 1 at a time when potentiometer No. 21 has been adjusted to barely make possible such lamp to be ON under the condition of smaller (neutral wire) feeding of electricity, such extra resistance during wire reversal (due to operating switch No. 14) will make bulb No. 18 go OFF. Lamp No. 20 is OFF before or after operating switch No. 14 since it is always connected between the Ground and Neutral wires.

Figure 4:
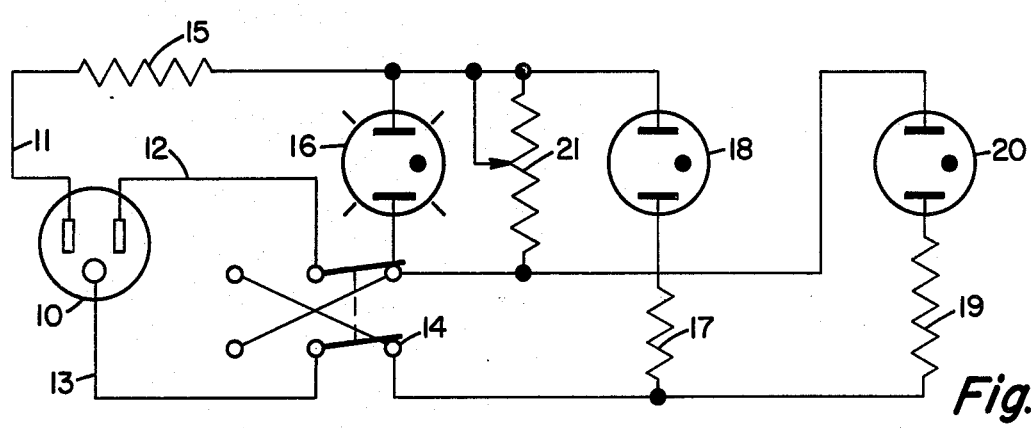
FIG. 4 simulates electrically and schematically the condition showing the defect of Ground to Neutral reversal with respect to the Hot wire. This is a test requiring a procedure to follow but it can be seen by inspection what indicating lamps or lights should be lighted and what lamps should be OFF.
Figure 5:
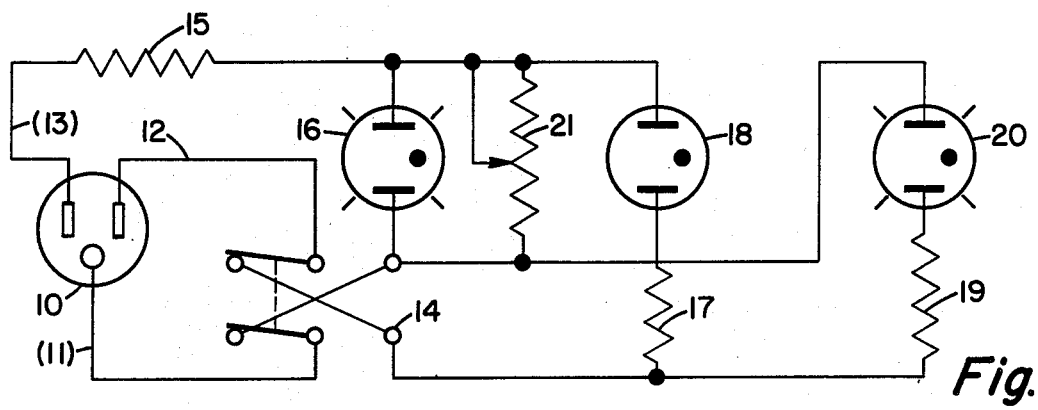
FIG. 5 simulates the electrical wiring fault known as Hot to Ground reversal, that is that the Hot wire is connected to the Ground wire or ground side of the receptacle. If this fault should exist a protective household circuit breaker would no doubt open and circuit requirements would call for the power to such lines to be cut off.
Figure 6:
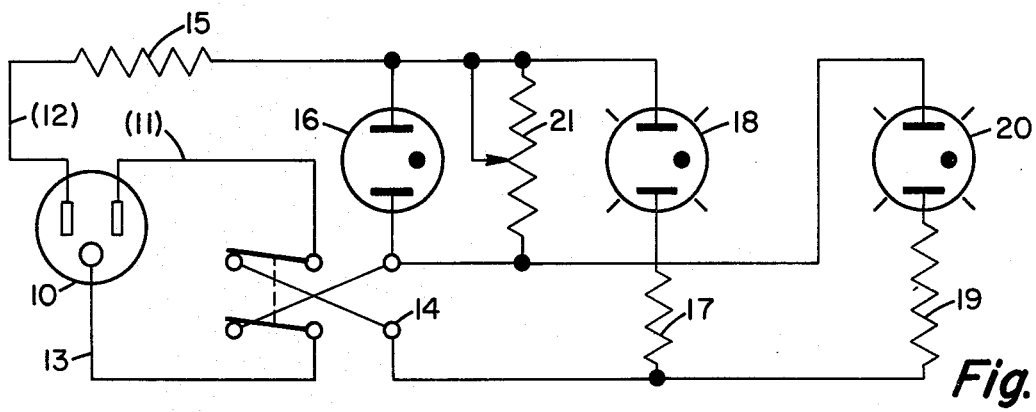

For clarity the conditions of lamps being OFF or On according to the defect in the wiring polarity is further given explicitly as follows (corresponding to the actual electrical condition existing as far as the invention is concerned and as given in the schematics as follows): FIG. 1 and FIG. 3 denote a correct (electrically) installation. FIG. 4 shows the schematic involving Ground to Neutral reversal. Such Ground to Neutral reversal is shown not to exist if lamp 18 goes out when switch 14 is operated. FIG. 5 shows a Hot to Ground reversal (Hot and Ground wires reversed in the wall socket). FIG. 6 shows a Hot and Neutral wire reversal.

| NEON LAMP "LOGIC" DISPLAY TABLE | | | |
|---|---|---|---|
| STATUS (Electrical) | LAMP LOGIC STATUS (lamp No.) | | |
| | 16 | 18 | 20 |
| NORMAL STATUS (CORRECT WIRING) | ON | ON | OFF |
| REVERSED HOT/NEUTRAL | OFF | ON | ON |
| REVERSED HOT/GROUND | ON | OFF | ON |
| REVERSED GROUND/NEUTRAL SHOWN NOT TO EXIST | ON | OFF | OFF |

The electrical circuit theory in connection with the invention will be given in the form of numbered relationships and nomenclature referring to FIG. 1 or FIG. 3 of the DRAWINGS and also to the figures where electrical defects in polarity have been simulated.

1. Normal circuit configurations (connoting no defects in the wires of the electrical wall socket tested by the invention) is that of FIG. 1 or FIG. 3, where both figures are electrically identical but where FIG. 3 is easier to follow circuit wise in determining how the invention performs its purpose of testing wall sockets.

2. The function of the double-pole-double-throw switch (No. 14 in FIG. 1) is to convert FIG. 1 circuitry to that of FIG. No. 4 circuitry when the switch is pressed by hand. This switch is a spring loaded unit that returns the circuit to the No. 1 figure in the drawings when the switch is released. Specifically, this switch only reverses lines No. 12 and No. 13, as shown in FIG. 1, when the switch is actuated, or pressed.

3. The voltage across lamp No. 18 plus its protective resistor No. 17 (in FIG. 1) is adjusted to 146.875 peak to peak volts (as measured with a 20,000 ohms per volt vacuum tube voltmeter) by means of potentiometer No. 21 (a marking on the case of the unit on the potentiometer knob rotating marker and underneath thereof will show this adjustment) with the lamp No. 18 still lighted. This voltage will become less (due to ground run resistance being more than neutral wire run resistance) when the switch No. 14 is pressed and the bulb No. 18 will be extinguished when the potential across it and its protective resistor No. 17 measures about 143.25 peak to peak. This is the only difficult adjustment in the procedure for using the invention. Note that it is possible to bring the voltage across lamp No. 16 to zero by adjusting resistor No. 21 to achieve zero resistance across lamp No. 16; so it is also possible to bring the voltage across lamp No. 18 and its protective resistor No. 17 to zero by the same process. The neon lamps between Neutral and Ground wires are OFF. The reason for this is that there is normally no potential between Neutral and Ground in a correctly wired circuit of the kind tested by the invention (also very little resistance is also between such lines).

4. There are no idealized or maximized parameters (or critical ones for that matter) in the values of the impedances used in the invention. Such circuit parameters and also the methods employed could be more idealized and also more sophisticated to achieve the method employed by the invention to discern if the Ground and the Neutral wires are reversed. For instance, a so called Schmitt trigger circuit could have been employed to discern the difference in voltage across lamp No. 18 to cause it to go out upon reversing switch No. 14. The simplicity of the applicant's invention is obvious. In fact the invention claimed can be workable empirically by pressing and release of switch No. 14 of FIG. 1 so that a blinking of lamp No. 18 occurs under such a process. Under most conditions the ground resistance path is greater than the load carrying neutral wire path for the electrical current.

5. Since the impedances involved in all the circuit constants of this invention have no reactances they will be more correctly termed resistances instead of impedances.

6. Lamp No. 20 of FIG. 1 is connected between neutral and ground lines (No. 12 and No. 13 of FIG. 3) and therefore has no voltage across it under normal correct wiring of the wall socket tested and will therefore be OFF.

6. Lamp No. 20 is used to show the defect of Hot to Neutral wire reversal, a condition which causes 115 volts to appear across it and its protective resistor No. 19 and the lamp will be then ON, as shown in FIG. 6.

7. No. 15 of FIG. 3 is a voltage dropping resistor for lamp No. 16 (these type of lamps normally light when 90 volts DC or rms appear across them, or about the voltage required for the specific NE 51 lamps used in this invention, however there is great variance in the voltage that will cause ionization in the lamps and that is why the invention should be rather used as depicted in No. 4 above).

8. Resistor No. 15 also protects the rest of the circuit if potentiometer No. 21 of FIG. 3 is made to have zero resistance across lamp No. 16, or across the No. 11 and No. 12 where such lamp No. 16 connects.

9. No. 17 is a voltage dropping resistor for neon lamp. No. 18.

10. No. 19 is a voltage dropping resistor for lamp No. 20.

11. No. 11 is the Hot line.

12. No. 12 is the Neutral line.

13. No. 13 is the Ground line.

14. Nos. 16; 18; 21 are neon lamps of the type known as NE51 and of the bayonet base type. It is intended that for this invention the "hard-wired" type of neon bulb be used in order to avoid the "contact-resistance" of the bulb to its socket. (Note that "contact-impedance" would be an incorrect name for this type of occurence in electrical circuitry.

15. No circuit equations (of voltage drops) are given for the invention since the functions can be seen by inspection (how the circuit of lamps points out defects in wiring). The type of lamps (neon type NE51) require normally a 100K (one hundred-thousand ohms) resistor for protection but much less value of resistances can be used.

16. FIG. No. 4 is the circuit showing the defect of Ground/Neutral reversal simulated. In most instances if this simulation can not be carried out it is very possible that it already exists in the installation tested. It is here that the invention has the most use and is most unique. The simplicity of being able to do this is not to be miscontrued that it is not logical, not feasible or not positive to achieve the invention's object. FIG. 4 shows by inspection that lamp No. 20 is OFF and lamps No. 16 and No. 18 are ON before operation of Switch 14 but see procedure for this test in No. 4 above.

17. FIG. No. 5 simulates the invention being used in a wall socket having the electrical wiring fault known as Hot to Ground reversal. If this fault would exist (and it is almost impossible it would without having the protective circuit breaker open and thus cut off the flow of electricity in the lines) the lighting of the lamps would be as follows: Lamp No. 18 would be OFF and lamps No. 16 and No. 20 would be ON.

19. FIG. No. 6 depicts the electrical wiring fault known as Hot line to Neutral line reversal. By inspection one can detect that the lamp that connects between the Neutral and Ground lines is the only lamp that can be OFF and this lamp is No. 16.

I claim:

1. Apparatus for testing the correct wiring of a wall socket having hot, neutral and ground terminals, including testing for ground and neutral reversal, comprising: a male plug having three prongs for contact with the hot, neutral and ground terminals of said wall socket, respectively, a double-pole, double-throw reversing switch having first and second poles and first and second pairs of stationary contacts, said first pair of stationary contacts comprising first and second contacts constituting one side of said switch and engageable by said first and second poles respectively in a first switch position, said second pair of stationary contacts comprising third and fourth contacts constituting the opposite side of said switch and engageable by said first and second poles respectively in a second, opposite position of said switch, said first contact being diagonally opposite the fourth contact and said second contact being diagonally opposite the third contact, a first conductor connecting together said first and fourth diagonally opposite contacts, a second conductor connecting together said second and third diagonally opposite contacts, the neutral prong of said plug being connected to the first pole of said switch and the ground prong being connected to the second pole of said switch; first neon lamp means; means connecting said first neon lamp means across the third and fourth stationary contacts; second neon lamp means; means connecting said second neon lamp means between the fourth stationary contact and a junction point; third neon lamp means; means connecting said third neon lamp means between the third stationary contact and the junction point; variable resistance means connected between said third stationary contact and said junction point; and means connecting said hot prong of the plug to said junction point; whereby when said plug is inserted into a three terminal walls socket having a higher resistance wire for the ground than for the neutral if correctly wired, in order to test for reversal of said neutral and ground wire connections, the double-pole, double-throw switch is placed in its first position connecting the first lamp across the hot and ground prongs and the second lamp across the hot and neutral prongs, the variable resistance is adjusted to bring the second lamp to a condition of energization just prior to extinction and the switch is then placed in its opposite position, thus reversing the neutral and ground prong connections, whereupon if the neutral and ground wire socket connections are not reversed the second lamp will be extinguished.

* * * * *